(12) United States Patent
Bosboom

(10) Patent No.: US 12,381,110 B2
(45) Date of Patent: Aug. 5, 2025

(54) APPARATUS, SYSTEM AND METHOD FOR PROVIDING A SUBSTRATE CHUCK

(71) Applicant: JABIL INC., St. Petersburg, FL (US)

(72) Inventor: Jeroen Bosboom, St. Petersburg, FL (US)

(73) Assignee: JABIL INC.

( * ) Notice: Subject to any disclaimer, the term of this patent is extended or adjusted under 35 U.S.C. 154(b) by 366 days.

(21) Appl. No.: 17/798,654

(22) PCT Filed: Feb. 15, 2021

(86) PCT No.: PCT/US2021/018114
§ 371 (c)(1),
(2) Date: Aug. 10, 2022

(87) PCT Pub. No.: WO2021/163664
PCT Pub. Date: Aug. 19, 2021

(65) Prior Publication Data
US 2023/0070848 A1    Mar. 9, 2023

Related U.S. Application Data

(60) Provisional application No. 62/976,165, filed on Feb. 13, 2020.

(51) Int. Cl.
*H01L 21/687* (2006.01)
*H01L 21/683* (2006.01)

(52) U.S. Cl.
CPC .... *H01L 21/68785* (2013.01); *H01L 21/6838* (2013.01); *H01L 21/68757* (2013.01)

(58) Field of Classification Search
CPC .......... H01L 21/6838; H01L 21/68757; H01L 21/68785
See application file for complete search history.

(56) References Cited

U.S. PATENT DOCUMENTS 7,285,483 B2 * 10/2007 Schauer .................. C30B 31/14
438/584
2001/0027744 A1 * 10/2001 Dietze ............... H01L 21/31662
117/89
2005/0252454 A1    11/2005 Parkhe et al.
(Continued)

FOREIGN PATENT DOCUMENTS

EP          1094502       4/2001
JP        05275513 A     10/1993
(Continued)

OTHER PUBLICATIONS

JP08-031719, Takechika, Feb. 1996, English (Year: 1996).*
(Continued)

*Primary Examiner* — Joseph A Miller, Jr.
(74) *Attorney, Agent, or Firm* — Riverside Law LLP

(57) ABSTRACT

An apparatus, system and method for providing a stationary chuck for positionally maintaining an associated in-process wafer. The stationary chuck may include a base plate having, on an upper surface thereof, a plurality of machined concentric ridges that form a series of concentric circular zones; a silicon carbide coating on the upper surface of the base plate; and a plurality of silicon carbide inlays capable of being bonded onto the silicon carbide coating in the concentric circular zones.

19 Claims, 4 Drawing Sheets

(56) References Cited

U.S. PATENT DOCUMENTS

| | | | | |
|---|---|---|---|---|
| 2006/0252243 | A1* | 11/2006 | Kishimoto | C30B 25/12 |
| | | | | 438/607 |
| 2009/0280248 | A1* | 11/2009 | Goodman | H01L 21/68757 |
| | | | | 118/728 |
| 2011/0084285 | A1* | 4/2011 | Noguchi | C30B 25/18 |
| | | | | 438/105 |
| 2015/0214090 | A1 | 7/2015 | Jin | |
| 2015/0321966 | A1 | 11/2015 | Shinohara | |
| 2016/0002774 | A1 | 1/2016 | Chae | |
| 2016/0201219 | A1 | 7/2016 | Corea | |
| 2016/0298263 | A1* | 10/2016 | Ishikawa | H01L 21/6719 |
| 2019/0088531 | A1* | 3/2019 | Sarode Vishwanath | |
| | | | | H01L 21/68742 |

FOREIGN PATENT DOCUMENTS

| | | | |
|---|---|---|---|
| JP | 08-031719 | * | 2/1996 |
| JP | 08031719 A | | 2/1996 |
| JP | 4001661 B2 | | 10/2007 |
| KR | 100965143 B1 | | 6/2010 |
| WO | 2017188145 | | 11/2017 |

OTHER PUBLICATIONS

Extended European Search Report issued in App. No. EP21752855, dated Mar. 7, 2024, 6 pages.
International Search Report and Written Opinion mailed on Jun. 9, 2021 in International Application No. PCT/US2021/018114.

* cited by examiner ered onto the billet to create a porous surface. However, such processes are fraught with risk, at least in that there is a great likelihood of gaps in the coating, or uneven or lumpy surfaces. Further, the balls may come loose during creation of the chuck or, worse yet, during wafer processing.

APPARATUS, SYSTEM AND METHOD FOR PROVIDING A SUBSTRATE CHUCK

CROSS-REFERENCE TO RELATED APPLICATION

This application claims the benefit of priority to U.S. Provisional Application No. 62/976,165, filed Feb. 13, 2020, entitled APPARATUS, SYSTEM AND METHOD FOR PROVIDING A SUBSTRATE CHUCK, the entirety of which is incorporated herein by reference as if set forth in its entirety.

BACKGROUND

Field of the Disclosure

The present disclosure relates to the transfer and processing of articles, such as semiconductor wafers, and more particularly to an apparatus, system and method for providing a substrate chuck.

Description of the Background

The use of robotics is well established as a manufacturing expedient, particularly in applications where human handling is inefficient and/or undesirable. One such circumstance is in the semiconductor arts, in which robotics and automated stations are used to handle and hold wafers during various process steps. Such process steps may include, by way of example, chemical mechanical planarization (CMP), etching, deposition, passivation, and various other processes in which a sealed and/or "clean" environment must be maintained, such as to limit the likelihood of contamination and to ensure that various specific processing conditions are met.

Current practice in the semiconductor arts to robotically handle these wafers often includes the use of a flipper/aligner operably attached to the robotics, such as in order to load semiconductor wafers from a loading stack into the various processing ports that may correspond to the aforementioned exemplary process steps. The robotics are employed to deploy the flipper/aligner to retrieve the wafer from a particular port or stack, such as before and/or after processing in an associated process chamber, and/or to associate the wafer with a station, such as may include a station chuck onto which the wafer is placed.

The wafer may thus be shuttled by the robotics connectively associated with the flipper/aligner between stations for additional processing. When a given wafer process is complete, the robotics may move the processed wafer from its station and return the processed semiconductor wafer to a loading port. It is typical that a stack of several semiconductor wafers is processed in this manner using the flipper/aligner-to-station movement during each process run.

Often, the aforementioned substrate/wafer processes require the use of highly refined measuring units. By way of example, a wafer inspection machine may employ a laser measuring unit that necessitates an extremely high degree of positional stability of the wafer with respect to the measuring unit, and hence with respect to the chuck upon which the wafer resides. Correspondingly, such aspects of a wafer processing system generally require a vacuum chuck, which may typically be made of silicon carbide.

However, due to the extreme hardness of silicon carbide, chucks formed from such a substance are difficult and costly to create, and the creation thereof may be extraordinarily time-consuming. Consequently, alternatives in creating refined silicon carbide vacuum chucks have been developed. For example, a billet plate may be coated with loose silicon carbide balls, such as on the order of 100 μm in size. The balls may be scintered or otherwise adhered onto the billet to create a porous surface. However, such processes are fraught with risk, at least in that there is a great likelihood of gaps in the coating, or uneven or lumpy surfaces. Further, the balls may come loose during creation of the chuck or, worse yet, during wafer processing.

More particularly, chucks are used to hold, for example, silicon waivers during these semiconductor wafer processes. During such processes, it is desirable that these chucks remain chemically inert and contamination free, such that the wafer is not damaged during processing. Moreover, these chucks should positionally maintain the wafer with very minimal variation, as referenced above, and hence must impart maximum positional rigidity, while also minimizing contact with the surface of the wafer so as not to damage aspects built upon the wafer.

Accordingly, there is a need for a low cost, highly rigid, readily manufacturable silicon carbide chuck for use in semiconductor processes.

SUMMARY

Certain embodiments are and include an apparatus, system and method for providing a stationary chuck for positionally maintaining an associated in-process wafer. The stationary chuck may include a base plate having, on an upper surface thereof, a plurality of machined concentric ridges that form a series of concentric circular zones; a silicon carbide coating on the upper surface of the base plate; and a plurality of silicon carbide inlays capable of being bonded onto the silicon carbide coating in the concentric circular zones.

Thus, the disclosure provides at least an apparatus, system and method for a low cost, highly rigid, readily manufacturable silicon carbide chuck for use in semiconductor processes.

BRIEF DESCRIPTION OF THE DRAWINGS

The exemplary compositions, systems, and methods shall be described hereinafter with reference to the attached drawings, which are given as non-limiting examples only, in which.

DETAILED DESCRIPTION

Figure 1:
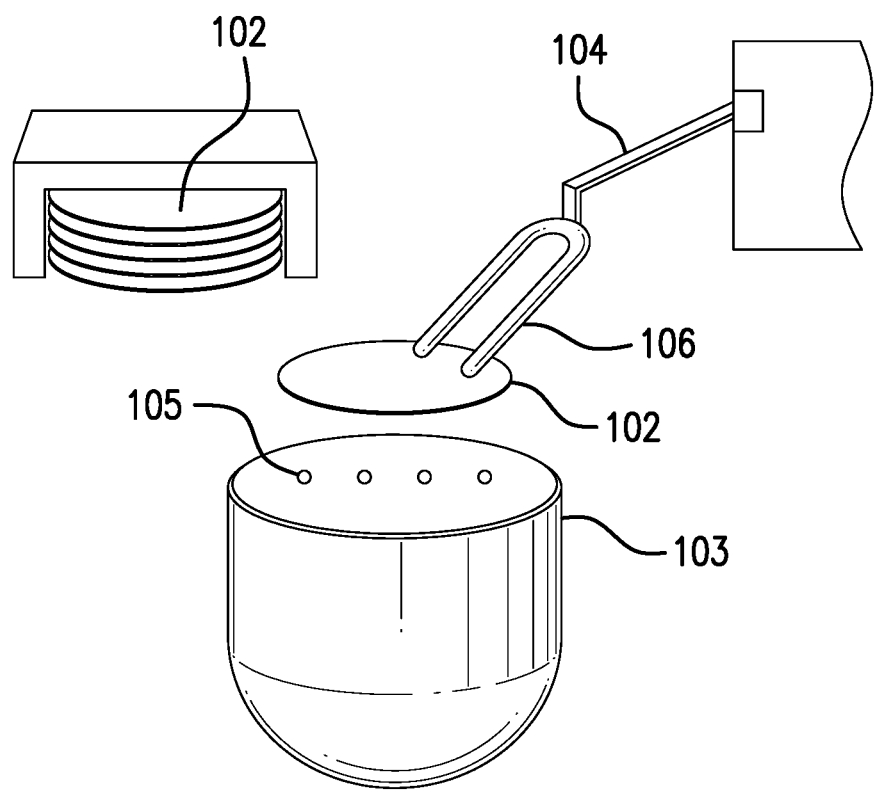
FIG. 1 is an illustration of a wafer handling system.

The figures and descriptions provided herein may have been simplified to illustrate aspects that are relevant for a clear understanding of the herein described apparatuses, systems, and methods, while eliminating, for the purpose of clarity, other aspects that may be found in typical similar devices, systems, and methods. Those of ordinary skill may thus recognize that other elements and/or operations may be desirable and/or necessary to implement the devices, systems, and methods described herein. But because such elements and operations are known in the art, and because they do not facilitate a better understanding of the present disclosure, for the sake of brevity a discussion of such elements and operations may not be provided herein. However, the present disclosure is deemed to nevertheless include all such elements, variations, and modifications to the described aspects that would be known to those of ordinary skill in the art.

Embodiments are provided throughout so that this disclosure is sufficiently thorough and fully conveys the scope of the disclosed embodiments to those who are skilled in the art. Numerous specific details are set forth, such as examples of specific components, devices, and methods, to provide a thorough understanding of embodiments of the present disclosure. Nevertheless, it will be apparent to those skilled in the art that certain specific disclosed details need not be employed, and that embodiments may be embodied in different forms. As such, the disclosed embodiments should not be construed to limit the scope of the disclosure. As referenced above, in some embodiments, well-known processes, well-known device structures, and well-known technologies may not be described in detail.

The terminology used herein is for the purpose of describing particular embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred or required order of performance. It is also to be understood that additional or alternative steps may be employed, in place of or in conjunction with the disclosed aspects.

When an element or layer is referred to as being "on", "upon", "connected to" or "coupled to" another element or layer, it may be directly on, upon, connected or coupled to the other element or layer, or intervening elements or layers may be present, unless clearly indicated otherwise. In contrast, when an element or layer is referred to as being "directly on," "directly upon", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). Further, as used herein the term "and/or" includes any and all combinations of one or more of the associated listed items.

Yet further, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Thus, terms such as "first," "second," and other numerical terms when used herein do not imply a sequence or order unless clearly indicated by the context. Thus, a first element, component, region, layer or section discussed below could be termed a second element, component, region, layer or section without departing from the teachings of the embodiments.

FIG. 1 illustrates an automated handling system 100 suitable to precisely handle semiconductor wafers, films or like-substrates 102, of varying diameters, compositions and physical attributes. The handling system 100 may be capable of the substrates 102 in a rapid, ordered succession for processing. The substrates 102 supplied may be manipulated or transferred among various stationary points 103 for processing, in part, by robotics, such as a robotic armature 104, equipped with an edge gripping system 106 adapted to perform the aforementioned manipulation and transfer. The stationary points 103 may comprise one or more chucks, such as may grip the substrates 102 upon placement of the substrates 102 onto the chuck. This gripping may be performed, by way of example, through the use of one or more vacuums 105.

Not only may substrates 102 vary in shape or diameter, they are also typically manufactured according to standardized specifications which, among other dimensional tolerances including the diameter, may require the surface of the stationary points 103 for receiving substrates 102 thereon to be substantially planar, such as with a flatness of 1.5 microns or less. Substrates may be silicon wafers, by way of example, such as 200 mm silicon wafers, for example, which may have a standard diameter of 200+/−0.2 mm and a standard thickness such as 675+/−25 microns. A typical wafer thickness after processing may range from about 500 microns to about 700 microns. Hence, maintenance of flatness across the substrate 102 during interaction of the substrate 102 with the stationary point 103 and with the robotic 104 and edge gripper 106 is key to obtaining acceptable levels of substrate throughput and waste in handling system 100.

It is well established that silicon carbide is a non-shedding compound, and hence is highly useful in wafer processing environments, at least due to the cleanliness provided the non-shedding nature of the silicon carbide. Furthermore, silicon carbide is static dissipative, and for this reason also is highly useful in wafer processing environments because undissipated static electricity can be harmful to in-process waivers.

Moreover, silicon carbide sheet stock may be vacuum permeable, and may be shaped in at least two dimensions. Silicon carbide may additionally be sputtered onto other substrates, like graphite. These "hybrid", or "plated", silicon carbide parts are frequently used in the semiconductor industry.

In combination, custom hybrid silicon carbide parts and vacuum permeable silicon carbide plates provide a suitable basis for the creation of wafer processing chucks, such as inspection platens. This is at least because a porous silicon carbide plate may provide a mountainous microscopic surface that is ideal for minimizing surface contact with the wafer portion placed upon the chuck, which is highly desirable in wafer processing so as to avoid damage or contamination of processed wafer aspects; and the rigidity imparted by the silicon carbide, as discussed above, maximizes wafer support during processing, which avoids "curling" damage to processed wafer aspects. By way of example, the pores provided in a silicon carbide plated part may be of a size of 15-30 µm, thus providing a very low contact surface.

More particularly, the embodiments may provide a hybrid silicon carbide wafer processing chuck on a structural graphite core or baseplate which is machinable using conventional equipment, such as CNC milling machines. This baseplate is much easier, quicker, and more economical to build than a billet silicon carbide plate. Also of note, the hybrid silicon carbide chuck base may have contoured vacuum packets, as discussed further hereinbelow, and porting on the backside thereof.

More specifically, the graphite core may be coated, such as via sputtering, with silicon carbide. The sputtering may be in an autoclave with a thickness of about 100 μm, by way of nonlimiting example. Accordingly, the embodiments may provide a hybrid silicon carbide chuck having equivalent properties to those of a billet silicon carbide plate.

The vacuum zone pockets referenced above may additionally accept therein fitted porous plates of approximately 1.5-3.5 mm in thickness, by way of nonlimiting example. The fitted porous plates may comprise pores in the range of 15-30 μm, by way of nonlimiting example, and may be bonded into the baseplate referenced above. These porous plates may further minimize wafer contact, which provides the process benefits discussed throughout.

Of note, the porous insert and hybrid baseplate may be independently clamped to a flat fixture plate. Indeed, the baseplate may comprise an access hole for this fixturing purpose, such as to allow a multitude of pins to reach through the baseplate and clamp the porous insert to a common datum or surface. The baseplate may also be clamped to this datum or surface, by way of non-limiting example.

As referenced above, the foregoing construction using silicon carbide plated parts and static dissipative porous silicon carbide insert plates may provide the ideal wafer holding process surface. That is, the wafer processing surface may provide maximum rigidity and minimum surface contact, and the embodiments may be built with shorter lead time, more quickly, less expensively and with greater ease than in the known art.

Figure 2:
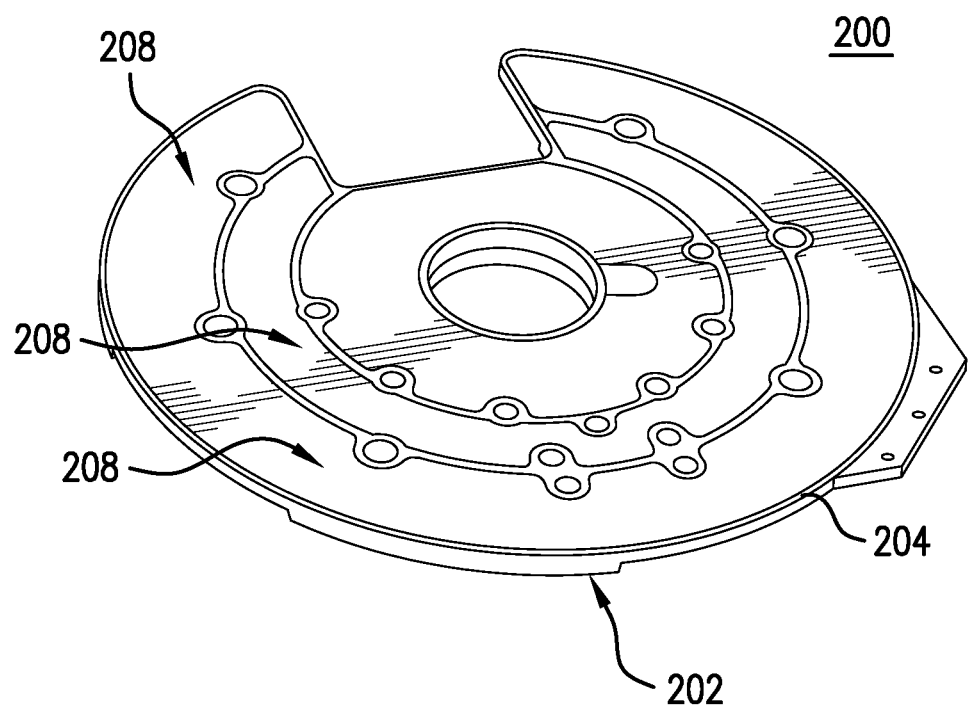
FIG. 2 is an illustration of aspects of a stationary chuck.

FIG. 2 illustrates a modular, hybrid silicon carbide chuck 200 in accordance with the embodiments. The chuck 200 may comprise a base core 202, such as a graphite core, having a silicon carbide coating 204 thereon. This coating 204 may range in thickness from 50-250 μm, and more particularly may be approximately 100 μm, by way of nonlimiting example. Moreover, the silicon carbide coating 204 may be static dissipative, and may have a rigidity of $10^5$-$10^9$ ohm-cm, by way of nonlimiting example.

Also illustrated in FIG. 2 are a plurality of porous silicon carbide vacuum inlay zones 208. Although three such zones 208 are illustrated in the embodiment of FIG. 2, it will be appreciated by the skilled artisan that other numbers of vacuum zones 208 may be employed without departing from the scope of the disclosure.

Figure 3:
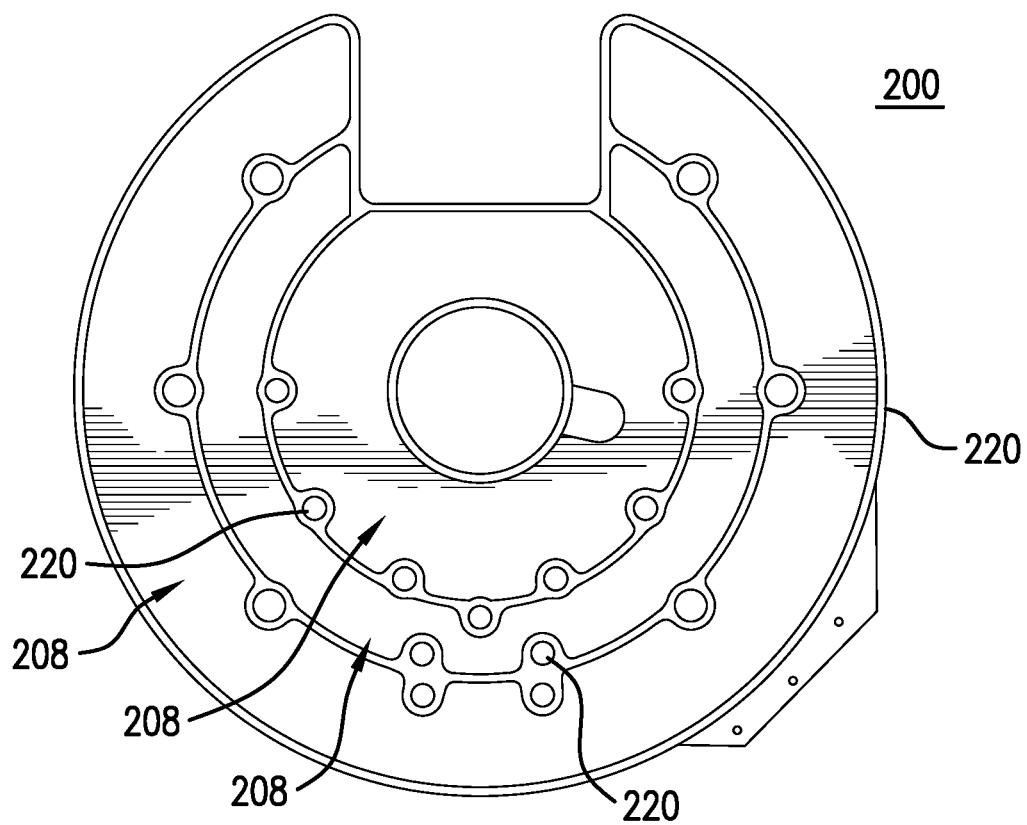
FIG. 3 is an illustration of aspects of a stationary chuck.

FIG. 3 is a top view of a silicon carbide coated chuck 200 having multiple, separated vacuum inlay zones 208. In the example, illustrated, three zones 208 are provided, and these zones may correspond to 150 mm, 200 mm, and 300 mm zones, by way of nonlimiting example. Each zone may include vacuum channels 220 correspondent o the size of the wafer to be accommodated in that zone. That is, each of the zones 208 may accommodate a different wafer size, although inner zones may be employed in conjunction with outer ring zones for larger waivers, so as to provide thereto additional positional rigidity.

Figure 4:
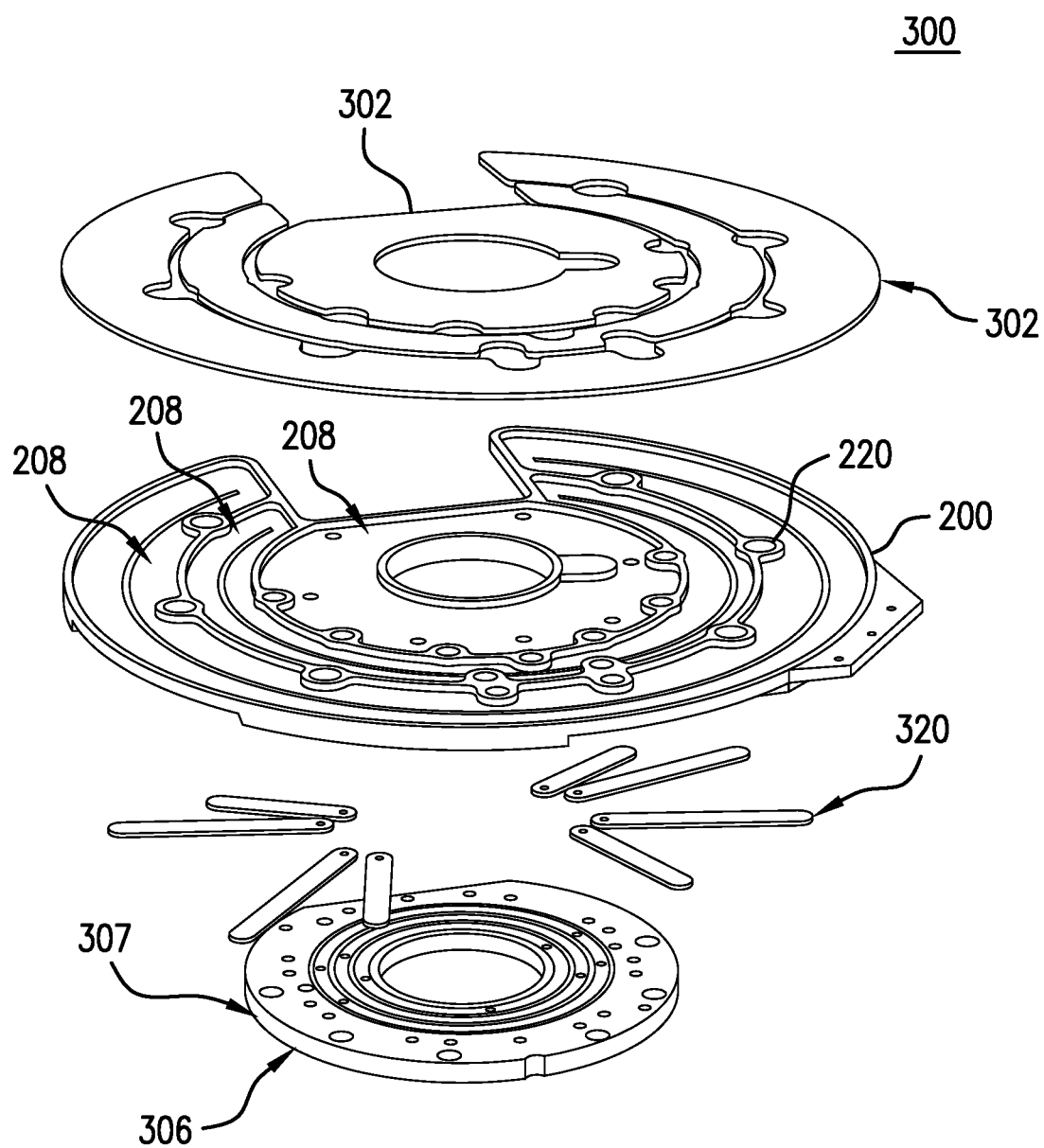
FIG. 4 is an illustration of aspects of a stationary chuck system.

FIG. 4 illustrates a modular chuck system 300 as described throughout this disclosure. In the middle of the three-part modular system illustrated in FIG. 4 is the silicon carbide coated chuck 200, having therein vacuum inlay zones 208, as discussed above with respect to FIGS. 2 and 3. Bonded or otherwise associated with the upper portion of this chuck 200 may be a series of porous inlays 302, such as may be comprised of silicon carbide. These porous inlays 302 made preferably be vacuum permeable, and may minimize wafer surface contact. The pores provided in the porous inlays 302 may be, for example, on the order of 10-75 μm, and more particularly on the order of 15-35 μm, by way of example.

At the lowermost portion of the illustration is provided a hub 306 that may be bonded to the underside of the silicon carbide coated chuck 200. The hub 306 may be doweled 307, for example, to provide optimal fit with the chuck 200, and may further be provided with vacuum and/or clamping through-holes 220, as illustrated. The hub 306 may be formed, by way of nonlimiting example, of stainless steel or a similar clean and inert material.

Also evident in the chuck system 300 of FIG. 4 are a series of vacuum channel seals 320. These vacuum channel seals 320 may provide optimal vacuum distribution to the silicon carbide coated chuck 200 through or around the hub 306.

Accordingly, the embodiments may provide the same silicon carbide chuck and low contact surface as the silicon carbide billet plate chuck of the known art, but at a significantly lower overall cost and with expedited construction time as compared to a known silicon carbide billet plate chuck. Needless to say, this allows for a modifiable, transferable, and scalable construction of the disclosed embodiments as compared to the known art.

Yet further, the embodiments may provide separated vacuum inlay zones, as detailed above, which may enable the use of various wafer sizes for processing with the disclosed embodiments. These vacuum inlay zones may include or have bonded thereto the referenced silicon carbide inlays to provide a highly porous surface that imparts a high ratio of vacuum contact to physical contact for the processed wafer associated with the chuck system disclosed herein.

The foregoing apparatuses, systems and methods may also include the control of the various robotic and vacuum functionality referenced throughout. Such control may include, by way of non-limiting example, manual control using one or more user interfaces, such as a controller, a keyboard, a mouse, a touch screen, or the like, to allow a user to input instructions for execution by software code associated with the robotics and with the systems discussed herein. Additionally, and as is well known to those skilled in the art, system control may also be fully automated, such as wherein manual user interaction only occurs to "set up" and program the referenced functionality, i.e., a user may only initially program or upload computing code to carry out the predetermined movements, vacuum draw and operational sequences discussed throughout. In either a manual or automated embodiment, or in any combination thereof, the control may be programmed, for example, to relate the known positions of substrates, the robotics, the stationary point, and the relative positions there between, for example.

It will further be appreciated that the herein described systems and methods may operate pursuant to and/or be controlled by any computing environment, and thus the computing environment employed is not to be presumed to limit the implementation of the herein described systems and methods in computing environments having various differing components and configurations. That is, the concepts described herein may be implemented in any of various computing environments using any of various components and configurations.

Further, the descriptions of the disclosure are provided to enable any person skilled in the art to make or use the disclosed embodiments. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but rather is to be accorded the widest scope consistent with the principles and novel features disclosed herein.

What is claimed is:

1. A stationary chuck for positionally maintaining an associated in-process wafer, comprising:
    a base plate having, on an upper surface thereof, a plurality of arcuate concentric ridges that form a series of concentric arcuate zones;
    a silicon carbide coating on the upper surface of the base plate; and
    a plurality of silicon carbide inlays capable of being bonded onto the silicon carbide coating in the concentric arcuate zones; and
    a flat fixture plate, wherein the plurality of silicon carbide inlays and base plate are independently clamped to the flat fixture plate.

2. The stationary chuck of claim 1, wherein the base plate is graphite.

3. The stationary chuck of claim 1, wherein the silicon carbide coating comprises a sputtered coating.

4. The stationary chuck of claim 1, wherein the stationary chuck is configured to positionally maintain the associated in-process wafer for inspection.

5. The stationary chuck of claim 1, wherein the silicon carbide coating comprises pores of a size of 15-30 μm.

6. The stationary chuck of claim 1, wherein the arcuate concentric ridges are CNC milled.

7. The stationary chuck of claim 1, wherein the silicon carbide coating comprises a thickness in a range of about 50-250 μm.

8. The stationary chuck of claim 7, wherein the silicon carbide coating comprises a thickness of about 100 μm.

9. The stationary chuck of claim 1, wherein the silicon carbide inlays have a thickness of about 1.5-3.5 mm.

10. The stationary chuck of claim 1, wherein the silicon carbide inlays comprise pores in the range of 15-30 μm.

11. The stationary chuck of claim 1, further comprising a plurality of vacuum ports passing through the baseplate and the silicon carbide coating.

12. The stationary chuck of claim 11, wherein the vacuum ports are substantially corresponded to the concentric arcuate ridges.

13. The stationary chuck of claim 1, wherein the silicon carbide coating is static dissipative in a range of $10^5$-$10^9$ ohm-cm.

14. The stationary chuck of claim 1, wherein the concentric arcuate ridges outline first, second and third zones.

15. The stationary chuck of claim 14, wherein the first, second, and third zones are sized to accept the in-process wafer having a size of 150 mm, a size of 200 mm, or a size of 300 mm, respectively.

16. The stationary chuck of claim 1, wherein the silicon carbide inlays are vacuum permeable.

17. The stationary chuck of claim 1, further comprising a hub bonded to an underside of the base plate.

18. The stationary chuck of claim 17, wherein the hub is composed of stainless steel.

19. The stationary chuck of claim 17, further comprising vacuum channel seals that distribute vacuum through the hub.

* * * * *